(12) United States Patent
Liaw

(10) Patent No.: US 11,784,226 B2
(45) Date of Patent: Oct. 10, 2023

(54) SEMICONDUCTOR GATE-ALL-AROUND DEVICE HAVING AN ANTI-PUNCH-THROUGH (APT) LAYER INCLUDING CARBON

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 259 days.

(21) Appl. No.: 17/097,945

(22) Filed: Nov. 13, 2020

(65) Prior Publication Data

US 2022/0157941 A1 May 19, 2022

(51) Int. Cl.
*H01L 29/10* (2006.01)
*H01L 29/78* (2006.01)
(Continued)

(52) U.S. Cl.
CPC .. *H01L 29/1083* (2013.01); *H01L 21/823814* (2013.01); *H01L 21/823821* (2013.01);
(Continued)

(58) Field of Classification Search
CPC ......... H01L 29/78696; H01L 29/42392; H01L 29/0673; H01L 29/66439; H01L 29/775; H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 21/823807; H01L 21/823412; H01L 29/105; H01L 29/1054;
(Continued)

(56) References Cited

U.S. PATENT DOCUMENTS 11,355,502 B2 * 6/2022 Liaw ................... H01L 27/1104
11,374,088 B2 * 6/2022 Liaw ................ H01L 29/41791
(Continued)

*Primary Examiner* — Younes Boulghassoul
(74) *Attorney, Agent, or Firm* — HAYNES AND BOONE, LLP

(57) ABSTRACT

A metal-oxide semiconductor field effect transistor (MOSFET) includes a substrate and a well over the substrate, the well including dopants of a first conductivity-type. The well includes an anti-punch-through (APT) layer at an upper section of the well, the APT layer including the dopants of the first conductivity-type and further including carbon. The MOSFET further includes a source feature and a drain feature adjacent the APT layer, being of a second conductivity-type opposite to the first conductivity-type. The MOSFET further includes multiple channel layers over the APT layer and connecting the source feature to the drain feature, wherein the multiple channel layers are vertically stacked one over another. The MOSFET further includes a gate wrapping around each of the channel layers, such as in a gate-all-around device, wherein a first portion of the gate is disposed between a bottommost one of the channel layers and the APT layer.

20 Claims, 9 Drawing Sheets

(51) Int. Cl.
*H01L 27/092* (2006.01)
*H01L 29/786* (2006.01)
*H01L 29/06* (2006.01)
*H01L 29/423* (2006.01)
*H01L 21/8238* (2006.01)
*H01L 29/66* (2006.01)

(52) U.S. Cl.
CPC .. *H01L 21/823892* (2013.01); *H01L 27/0924* (2013.01); *H01L 27/0928* (2013.01); *H01L 29/0638* (2013.01); *H01L 29/0673* (2013.01); *H01L 29/42392* (2013.01); *H01L 29/66795* (2013.01); *H01L 29/785* (2013.01); *H01L 29/78696* (2013.01); *H01L 27/092* (2013.01); *H01L 29/66545* (2013.01)

(58) Field of Classification Search
CPC ........... H01L 21/26513; H01L 21/2652; H01L 21/266; H01L 21/425–426; H01L 21/041; H01L 21/045; H01L 21/26506; H01L 21/26533; H01L 29/1083; H01L 29/66537; H01L 29/0638; H01L 27/0928; H01L 21/823892; H01L 27/0925; H01L 27/0927; H01L 21/823493
See application file for complete search history.

(56) References Cited

U.S. PATENT DOCUMENTS

| | | | |
|---|---|---|---|
| 2014/0227846 A1* | 8/2014 | Liaw | H01L 29/66545 438/283 |
| 2015/0035071 A1* | 2/2015 | Ching | H01L 29/16 257/369 |
| 2015/0102287 A1* | 4/2015 | Wang | H01L 29/78696 257/26 |
| 2019/0131405 A1* | 5/2019 | Hsiao | H01L 21/823807 |
| 2019/0393040 A1* | 12/2019 | Chen | H01L 27/0924 |
| 2020/0044087 A1* | 2/2020 | Guha | H01L 29/42392 |
| 2020/0052116 A1* | 2/2020 | Kim | H01L 21/823807 |
| 2020/0135469 A1* | 4/2020 | Liu | H01L 21/26506 |
| 2020/0373385 A1* | 11/2020 | Lim | H01L 29/42392 |
| 2021/0066506 A1* | 3/2021 | Liaw | H01L 29/66545 |

* cited by examiner

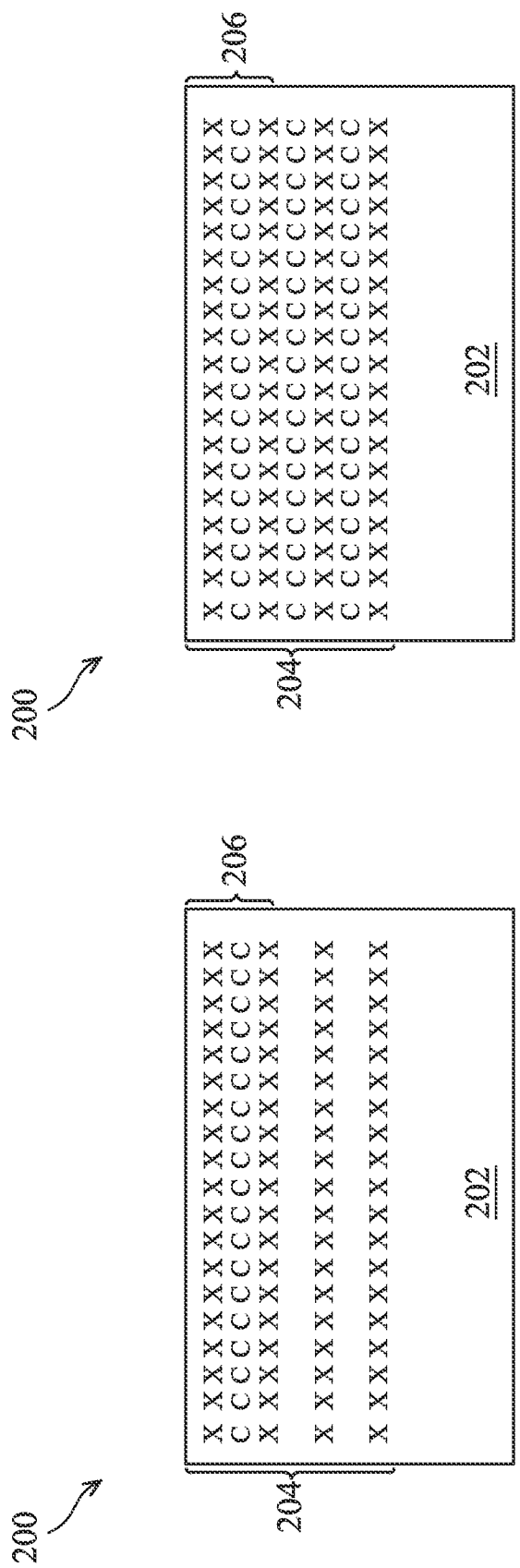

SEMICONDUCTOR GATE-ALL-AROUND DEVICE HAVING AN ANTI-PUNCH-THROUGH (APT) LAYER INCLUDING CARBON

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multi-gate devices have been introduced to improve gate control. Multi-gate devices have been observed to increase gate-channel coupling, reduce OFF-state current, and/or reduce short-channel effects (SCEs). One such multi-gate device is the gate-all-around (GAA) device, referring to a vertically-stacked horizontally-oriented multi-channel transistor, such as a nanowire transistor and nanosheet transistor. GAA devices enable aggressive down-scaling of IC technologies, maintaining gate control and mitigating SCEs, while seamlessly integrating with conventional IC manufacturing processes. However, there are also challenges in GAA devices. One such challenge is how to control the leakage current in semiconductor layer(s) that are not fully surrounded by a gate, such as the semiconductor layer below the bottommost nanosheet or nanowire. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A and 7A are diagrammatic cross-sectional views of the GAA device in FIG. 1, in portion, at midpoints of the method of FIG. 7, according to some embodiments of the present disclosure.

FIGS. 6B and 7B are diagrammatic cross-sectional views of the GAA device in FIG. 1, in portion, at midpoints of the method of FIG. 7, according to other embodiments of the present disclosure.

DETAILED DESCRIPTION

Figure 1:
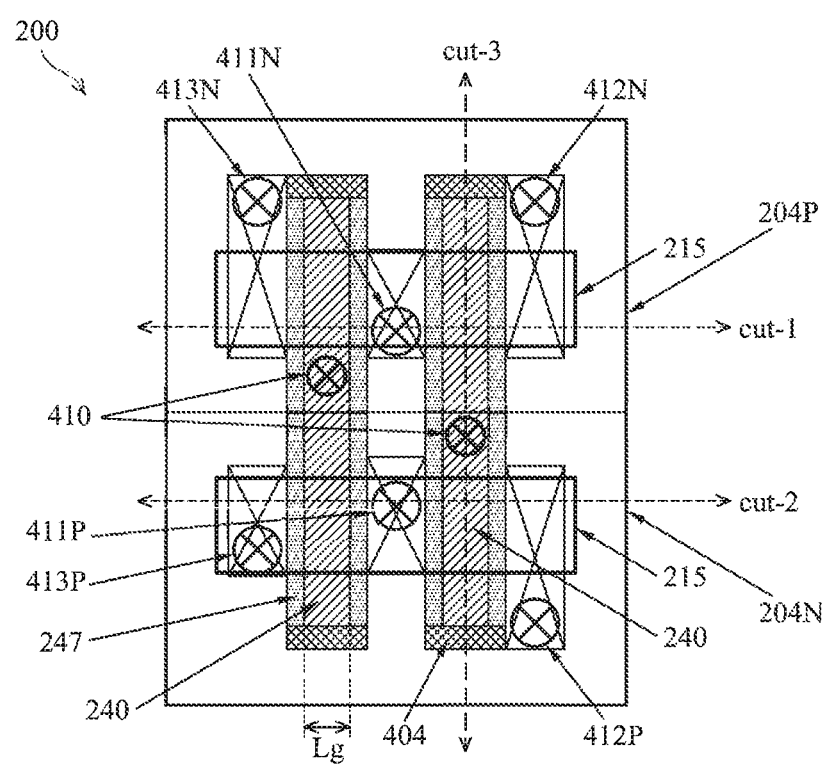
FIG. 1 is a top view of a layout of a GAA device, in portion, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "adjacent," "upper" and the like, may be used herein for ease of description to describe one element or feature's relationship to another element(s) or feature(s) as illustrated in the figures. The spatially relative terms are intended to encompass different orientations of the device in use or step in addition to the orientation depicted in the figures, as well as the possibility of one or more intervening layers therebetween. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/− 10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to semiconductor devices and the fabrication thereof, and more particularly to gate-all-around (GAA) devices such as vertically-stacked gate-all-around horizontal nanowire or nanosheet metal oxide semiconductor field effect transistor (MOSFET) devices with an extremely narrow cylindrical or sheet channel body. GAA devices are promising due to good gate control ability, lower leakage current, shrink capability, and fin-type field effect transistor (FinFET) device layout compatibility. However, various aspects of GAA devices still need improvement. For example, in some implementations, there is a semiconductor layer below the bottommost channel layer and disposed between a source and a drain. Part of the gate electrode surrounding the bottommost channel layer is also disposed upon this semiconductor layer, resulting in a conducting channel through this semiconductor layer, similar to a planar transistor. This planar conducting channel can provide difficulties. For example, its threshold voltage may not match the nanowire/nanosheet channels, and the leakage current through this semiconductor layer could be an issue for some applications. For example, this leakage current directly contributes to excessive power consumption when a device is in standby (or non-active) mode. The general purposes of the present disclosure include providing an anti-punch-through (APT) doping in this semiconductor layer (referred to as an APT layer) for reducing the leakage current. The doping concentration of the APT layer is controlled in a range such that it is sufficiently high for suppressing the leakage current while sufficiently low for minimizing dopant diffusion into the channel layers during APT ion implantation and during subsequent thermal processes. In some embodiments, the APT layer works in conjunction with proper biasing to the source terminals, drain terminals, and the wells (P wells and N wells) to reduce the leakage current. The details of the structure and fabrication methods of the present disclosure are described below in conjunction with the accompanied drawings, which illustrate a GAA device and the process of making the same, according to some embodiments. Those of ordinary skill in the art should appreciate that they may readily use the present disclosure as a basis for designing or modifying other processes and structures for carrying out the same purposes and/or achieving the same advantages of the embodiments introduced herein.

FIGS. 1, 2A, 2B, 3A, 3B, and 4 are diagrammatic views of a GAA device 200, in portion, according to some embodiments of the present disclosure. FIG. 1 is a top view of the device 200 in an X-Y plane. FIGS. 2A, 2B, 3A, 3B, and 4, are cross-sectional views of the GAA device in FIG. 1, in portion, along the "cut-1" line, "cut-2" line, and "cut-3" line in FIG. 1, respectively.

In some embodiments, the device 200 may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 1 through 4 have been simplified for the sake of clarity to better understand the inventive concepts of the present disclosure. Additional features can be added in the device 200, and some of the features described below can be replaced, modified, or eliminated in other embodiments of the device 200.

Turning to FIGS. 1, 2A, 2B, 3A, 3B, and 4, the device 200 includes a substrate 202 and multiple wells, such as an N well (or n-type well) 204N and a P well (or p-type well) 204P, formed in or on the substrate 202. An anti-punch-through (APT) layer 206N is provided in the top section of the N well 204N and an APT layer 206P is provided in the top section of the P well 204P. A stack of channel layers 215 are disposed over the APT layer 206N and another stack of channel layers 215 are disposed over the APT layer 206P. The channel layers 215 are oriented lengthwise along the "y" direction and widthwise along the "x" direction. The device 200 further includes gate stacks (such as high-k metal gate stacks) 240 that are oriented lengthwise along the "x" direction and engage the channel layers 215 to form GAA transistors. Particularly, each gate stack 240 wraps around the respective channel layers 215. The device 200 further includes gate spacers 247 on sidewalls of the gate stacks 240 and gate-end dielectric features 404 at both ends of each gate stack 240. The device 200 further includes contacts disposed over source/drain regions between the adjacent gate spacers 247 and various vias including source vias 412N and 412P, drain vias 411N and 411P, and gate via 410. The contacts and vias are coupled to various voltage or signal lines, as appropriate.

In an embodiment, substrate 202 includes silicon, such as a silicon wafer. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AnnAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In the present embodiment, the P wells 204P and the N wells 204N include the same semiconductor material(s) as the substrate 202. The P wells 204P are further doped with p-type dopants, such as boron, indium, other p-type dopant, or combinations thereof, configured for n-type GAA transistors. The N wells 204N are further doped with n-type dopants, such as phosphorus, arsenic, other n-type dopant, or combinations thereof, configured for p-type GAA transistors. In some implementations, the wells 204N are formed with a combination of p-type dopants and n-type dopants but with a net effect of being n-type doped. In some implementations, the wells 204P are formed with a combination of p-type dopants and n-type dopants but with a net effect of being p-type doped. The various doped regions can be formed directly on and/or in substrate 202, by an ion implantation process, a diffusion process, and/or other suitable doping process.

Figure 2A:
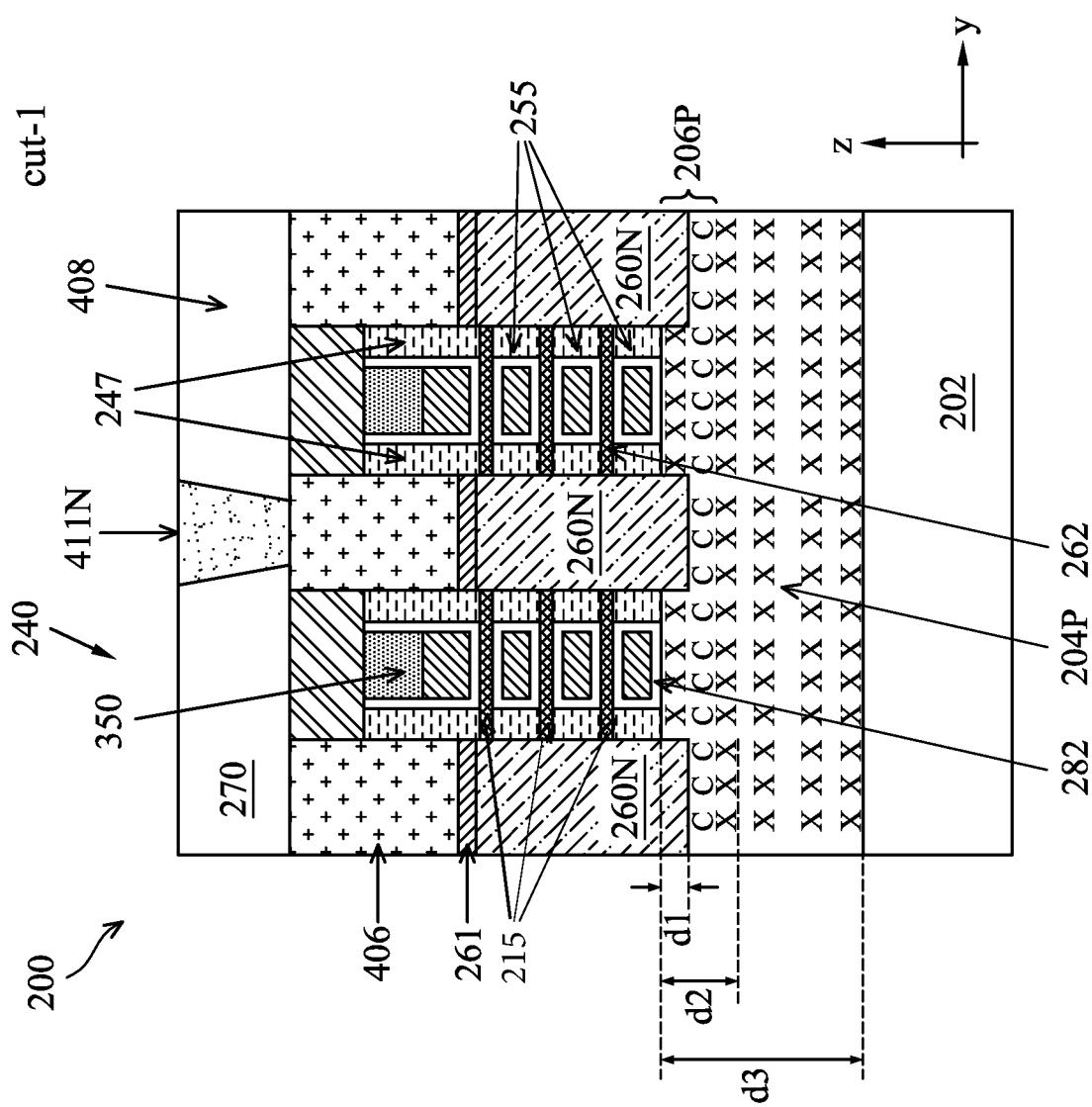
FIGS. 2A and 3A are diagrammatic cross-sectional views of the GAA device in FIG. 1, in portion, along the "cut-1" line and the "cut-2" line in FIG. 1 respectively, according to some embodiments of the present disclosure.
Figure 2B:
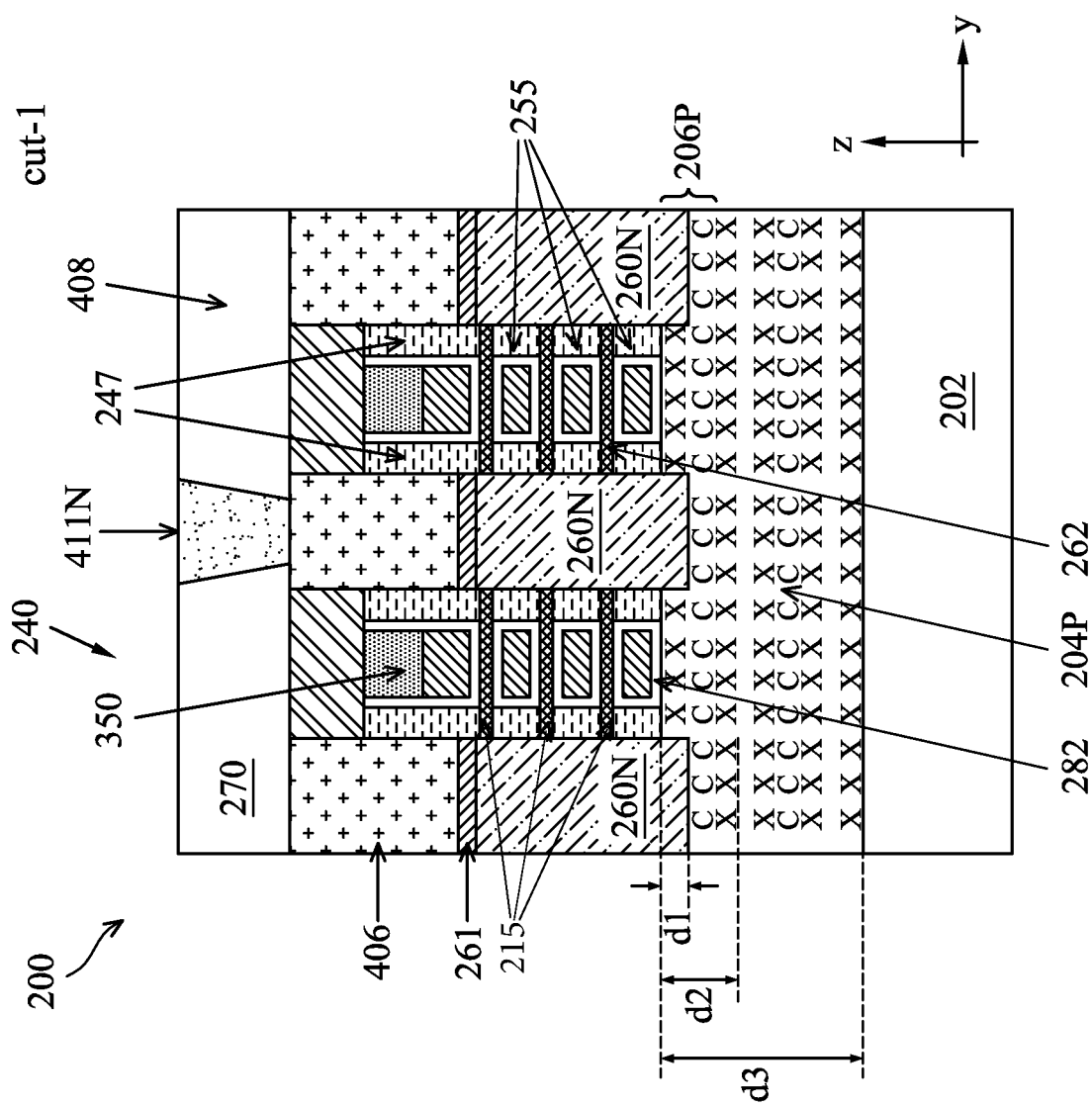
FIGS. 2B and 3B are diagrammatic cross-sectional views of the GAA device in FIG. 1, in portion, along the "cut-1" line and the "cut-2" line in FIG. 1 respectively, according to some other embodiments of the present disclosure.
Figure 3A:
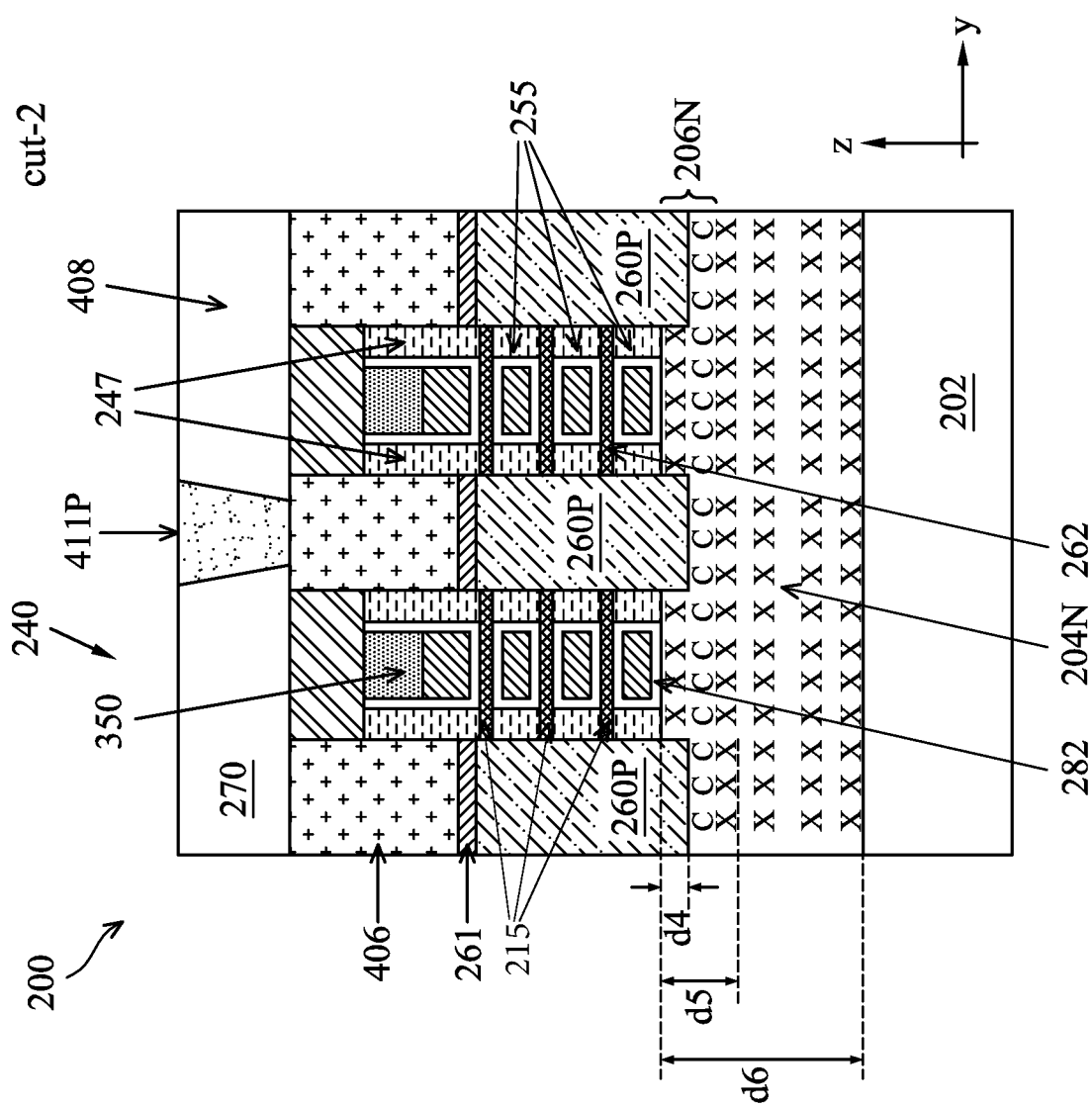
Figure 3B:
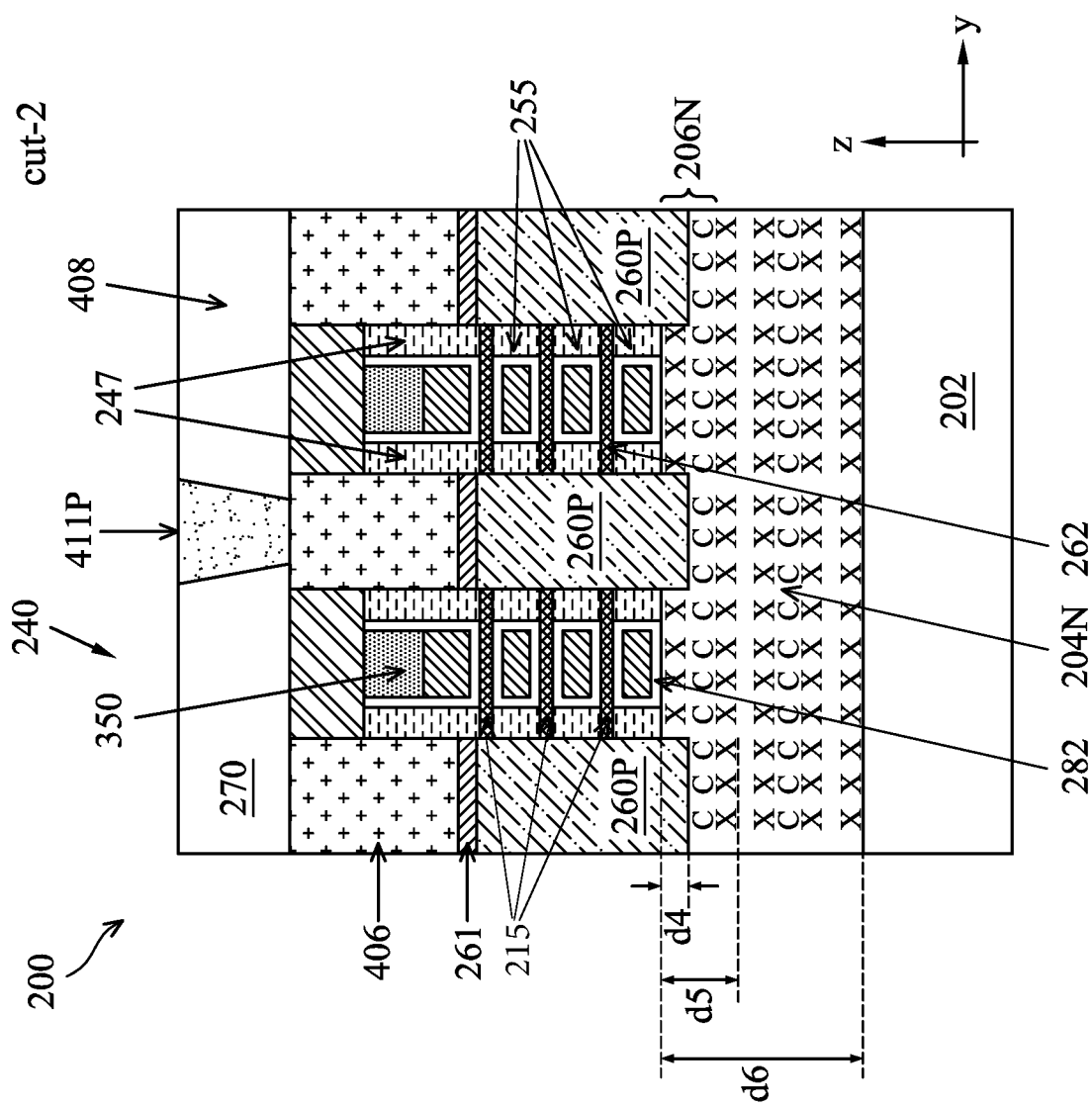

As shown in FIGS. 2A, 2B, the device 200 further includes n-type doped source/drain features 260N disposed over the P well 204P for forming NMOS GAA transistors, and As shown in FIGS. 3A, 3B, p-type doped source/drain features 260P disposed over the N well 204N for forming PMOS GAA transistors. The source/drain features 260N and 260P may be formed using epitaxial growth. For example, a semiconductor material is epitaxially grown from portions of substrate 202, the wells 204 (204N and 204P), the APT layers 206 (206N an d206P), and semiconductor layers 210 (see FIGS. 6A, 6B, 7A, 7B), 215, forming epitaxial source/drain features 260N and 260P. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202, the wells 204P/204N, and semiconductor layers 215. In some embodiments, the epitaxial source/drain features 260N may include silicon and may be doped with carbon, phosphorus, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260P may include silicon germanium or germanium and may be doped with boron, other p-type dopant, or combinations thereof (for example, forming Si:Ge:B epitaxial source/drain features). In some embodiments, epitaxial source/drain features 260N and/or 260P include more than one epitaxial semiconductor layer, where the epitaxial semiconductor layers can include the same or different materials and/or dopant concentrations. In some embodiments, epitaxial source/drain features 260N and/or 260P include materials and/or dopants that achieve desired tensile stress and/or compressive stress in respective channel layers 215 of the GAA transistors. In some embodiments, epitaxial source/drain features 260N and 260P are doped during deposition by adding impurities to a source material of the epitaxy process (i.e., in-situ). In some embodiments, epitaxial source/drain features 260N and 260P are doped by an ion implantation process subsequent to a deposition process. In some embodiments, annealing processes (e.g., rapid thermal annealing (RTA) and/or laser annealing) are performed to activate dopants in epitaxial source/drain features 260N and 260P. In some embodiments, epitaxial source/drain features 260N and 260P are formed in separate processing sequences that include, for example, masking PMOS GAA transistor regions when forming epitaxial source/drain features 260N in NMOS GAA transistor regions and masking NMOS GAA transistor regions when forming epitaxial source/drain features 260P in PMOS GAA transistor regions.

A first stack of semiconductor layers 215 are suspended between each pair of the source/drain features 260N and another stack of semiconductor layers 215 are suspended between each pair of the source/drain features 260P. The stacks of semiconductor layers 215 serve as the transistor channels for the respective GAA devices. Accordingly, the semiconductor layers 215 are also referred to as channel layers 215. The channel layers 215 may include silicon germanium (SiGe). Alternatively, the channel layers 215 may comprise silicon, germanium, silicon germanium, or another suitable semiconductor material(s). In the present embodiment, the channel layers 215 are undoped or are substantially free from the dopants that are in the APT layers 206N and 206P. In other embodiments, the channel layers 215 may be doped with a very low concentration of dopants. For example, the dopant concentration in the channel layers 215 may be lower than about 5E16 atom/cm$^3$. Initially, the channel layers 215 are formed as part of a semiconductor layer stack that includes the channel layers 215 and semiconductor layers 210 (see FIGS. 6A, 6B, 7A, 7B). During a gate replacement process, the semiconductor layer stack may be selectively etched to remove the sacrificial semiconductor layers, leaving the channel layers 215 suspended over the substrate 202 and between the respective source/drain features 260N, 260P.

Referring to FIGS. 2A and 2B, in various embodiments, the n-type source/drain features 260N extend below the top surface of the APT layer 206P (which is also the top surface of the well 204P) by a depth d1. In some embodiments, the depth d1 is in a range of about 5 nm to about 25 nm. In the present embodiments, the APT layer 206P has a depth d2 measured from the top surface of the APT layer 206P (which interfaces with the gate dielectric layer 282). The depth d2 may be up to 40 nm in some embodiments, such as from about 5 nm to about 50 nm. The depth d2 is less than the depth d3 in various embodiments. The well 204P has a depth d3 measured from the top surface of the APT layer 206P (which is considered as part of the well 204P). The depth d3 may be up to 300 nm in some embodiments, such as from about 100 nm to about 400 nm. The dopant concentration in the well 204P may be in a range of about 1E16 atom/cm$^3$ to about 1E19 atom/cm$^3$ in some embodiments, depending on well resistance requirements.

Referring to FIGS. 3A and 3B, in various embodiments, the p-type source/drain features 260P extend below the top surface of the APT layer 206N (which is also the top surface of the well 204N) by a depth d4. In some embodiments, the depth d4 is in a range of about 5 nm to about 25 nm. In some embodiments, the depth d4 is greater than the death d1 of the n-type source/drain features discussed with reference to FIGS. 2A and 2B, by at least 3 nm, and preferably within 15 nm. This is because a PMOSFET channel mobility is correlated to the source/drain epi dimension. That is, the deeper source/drain means a larger volume and therefore resulting stronger strain for PMOSMET ion improvement.

The APT layer 206N has a depth d5 measured from the top surface of the APT layer 206N (which interfaces with the gate dielectric layer 282). The depth d5 may be up to 40 nm in some embodiments, such as from about 5 nm to about 50 nm. The depth d5 is less than the depth d4 in various embodiments. The well 204N has a depth d6 measured from the top surface of the APT layer 206N (which is considered as part of the well 204N). The depth d6 may be up to 300 nm in some embodiments, such as from about 100 nm to about 400 nm. The dopant concentration in the well 204N may be in a range of about 1E16 atom/cm$^3$ to about 1E19 atom/cm$^3$ in some embodiments, depending on well resistance requirements.

The doping of the wells 204P, 204N and the APT layers 206P, 206N can vary in different embodiments. One such embodiment is shown in FIGS. 2A and 3A. Referring to FIG. 2A, the APT layer 206P includes the same semiconductor material(s) as the well 204P and is considered as part of the P well 204P. In addition, the APT layer 206P is doped with carbon. This can be achieved in different ways. In one example, a relatively-low energy implantation process, such as in a range from about 10 to 50 KeV, can be used to dope the APT layer 206P with carbon and p-type dopants (e.g., boron or indium). One or more relatively-high energy implantation processes, such as two implant processes with an implant energy greater than about 50 KeV, can be used to dope the remainder of the well 204P with the p-type dopant (e.g., boron, indium, or boron-fluoride).

Referring to FIG. 3A, the APT layer 206N includes the same semiconductor material(s) as the well 204N and is considered as part of the N well 204N. In addition, the APT layer 206N is doped with carbon. As above, this can be achieved in different ways. In one example, a relatively-low energy implantation process, such as in a range from about 10 to 50 KeV, can be used to dope the APT layer 206N with carbon and n-type dopants (e.g., phosphorus or arsenic). One or more relatively-high energy implantation processes, such as two implant processes with an implant energy greater than about 50 KeV, can be used to dope the remainder of the well 204N with the n-type dopant (e.g., phosphorous or arsenic).

Another embodiment for the doping of the wells 204P, 204N and the APT layers 206P, 206N is shown in FIGS. 2B and 3B. Referring to FIG. 2B, the APT layer 206P includes the same semiconductor material(s) as the well 204P and is considered as part of the P well 204P. In this embodiment, both the APT layer 206P and well 204P are doped with carbon. This can be achieved in different ways. In one example, a relatively-low energy implantation process, such as in a range from about 10 to 50 KeV, can be used to dope the APT layer 206P with carbon and p-type dopants (e.g., boron or indium). One or more relatively-high energy implantation processes, such as two implant processes with an implant energy greater than about 50 KeV, can be used to dope the remainder of the well 204P with carbon and the p-type dopant.

Referring to FIG. 3B, the APT layer 206N includes the same semiconductor material(s) as the well 204N and is considered as part of the N well 204N. In this embodiment, both the APT layer 206N and well 204N are doped with carbon. As above, this can be achieved in different ways. In one example, a relatively-low energy implantation process, such as in a range from about 10 to 50 KeV, can be used to dope the APT layer 206N with carbon and n-type dopants (e.g., phosphorus or arsenic). One or more relatively-high energy implantation processes, such as two implant processes with an implant energy greater than about 50 KeV, can be used to dope the remainder of the well 204N with carbon and the n-type dopant.

Figure 4:
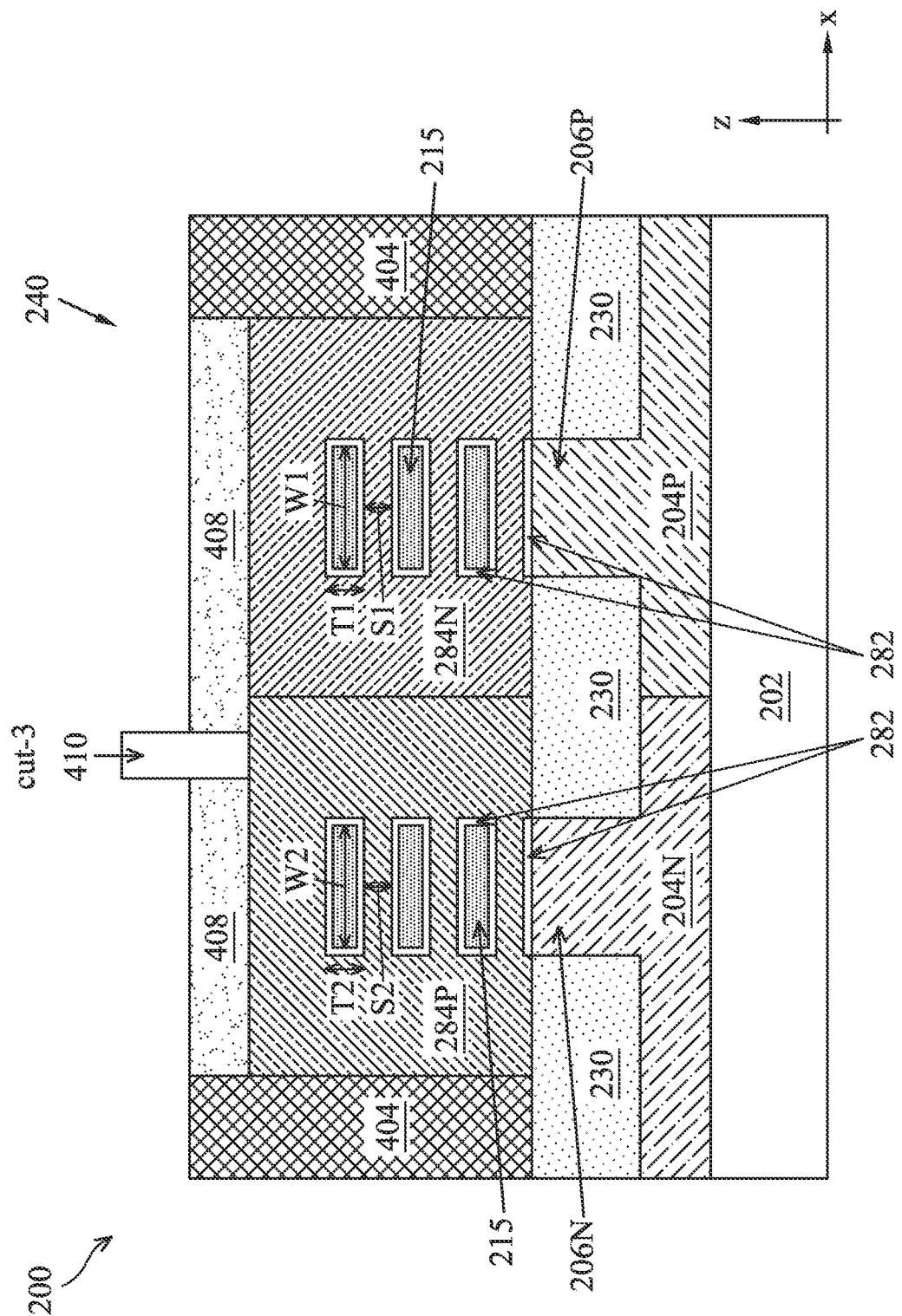
FIG. 4 is a diagrammatic cross-sectional view of the GAA device in FIG. 1, in portion, along the "cut-3" line in FIG. 1, according to some embodiments of the present disclosure.

As shown in FIG. 4, the device 200 further includes isolation features 230 over the substrate 202 and adjacent to upper sections of the wells 204N and 204P including the APT layers 206N and 206P. Isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 may include different structures, such as shallow trench isolation (STI) structures, deep trench isolation (DTI) structures, and/or local oxidation of silicon (LOCOS) structures. For example, isolation features 230 can include STI features that define and electrically isolate the doped regions. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in FIG. 4, the channel layers 215 for NMOS GAA are separated from each other by a spacing S1 along the z-direction, and the channel layers 215 for PMOS GAA are separated from each other by a spacing S2 along the z-direction. In the depicted embodiment, spacing S1 is about equal to S2 (for example, S1 and S2 are within 5% from each other), though the present disclosure contemplates embodiments where spacing S1 is different than spacing S2. Further, channel layers 215 for NMOS GAA have a width W1 along the "x" direction and a thickness "T1" along the "z" direction, and channel layers 215 for PMOS GAA have a width W2 along the "x" direction and a thickness "T2" along the "z" direction. In the depicted embodiment, thickness T1 is about equal to thickness T2 (for example, T1 and T2 are within 5% from each other), though the present disclosure contemplates embodiments where thickness T1 is different than thickness T2. In some embodiments, each of the thicknesses T1 and T2 may be in a range of about 4 nm to about 8 nm, and each of the spacing S1 and S2 may be in a range of about 6 nm to about 15 nm. Further, the sum of T1+S1 (and the sum of T2+S2) may be in a range of about 10 nm to 23 nm in some embodiments. In an embodiment, width W1 is about equal to width W2. In another embodiment, width W2 is different from width W1 depending on design objectives. For example, width W2 can be designed to be larger than width W1 to boost PMOSFET GAA's performance. The present disclosure contemplates embodiments where width W1 and width W2 have any configurations including W1 is equal to, smaller than, or greater than W2. Each of with widths W1 and W2 may be in a range of about 4 nm to about 70 nm in various embodiments. In some embodiments, the channel layers 215 may be cylindrical-shaped (e.g., nanowire), rectangular-shaped (e.g., nanobar), sheet-shaped (e.g., nanosheet), etc.), or have other suitable shapes.

The gate stacks 240 include a gate dielectric layer 282, a work function metal layer 284 (represented with numerals 284P for PMOS GAA and 284N for NMOS GAA), and a low resistance metal fill layer 350 in various embodiments. As shown in FIG. 4, the low resistance metal fill layer 350 may be omitted in the gate stacks 240 in some embodiments. The gate stack 240 for a PMOS GAA is disposed between a pair of p-type source/drain features 260P, and the gate stack 240 for an NMOS GAA is disposed between a pair of n-type source/drain features 260N. As shown in FIG. 1, some gate stacks 240 straddle a PMOS GAA and an NMOS GAA, and becomes a common gate for the PMOS GAA and the NMOS GAA. Although not shown in FIG. 1, a gate stack 240 may engage a PMOS GAA only or an NMOS GAA only. Further, the width of the gate stacks 240 (also referred to as gate length, which is a dimension along the "y" direction in FIG. 1), Lg, is in a range of 4 nm to 30 nm in various embodiments.

The gate dielectric layer 282 wraps around each of the semiconductor layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by chemical oxidation, thermal oxidation, atomic layer deposition (ALD), chemical vapor deposition (CVD), and/or other suitable methods, and may have a thickness in a range of about 0.5 nm to about 3 nm. In some embodiments, the gate stacks 240 further include an interfacial layer between the gate dielectric layer 282 and the channel layers 215. The interfacial layer may include silicon dioxide, silicon oxynitride, or other suitable materials. In some embodiments, the work function metal layer 284N includes an n-type work function layer for NMOSFET GAA device, and the work function metal layer 284P includes a p-type work function layer for PMOSFET GAA device. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The low resistance metal fill layer 350 may include tungsten, ruthenium, copper, and/or other suitable materials; and may be formed by CVD, PVD, plating, and/or other suitable processes. Since the gate stack 240 includes a high-k dielectric layer and metal layer(s), it is also referred to as a high-k metal gate. The low resistance metal fill layer 350 is not disposed in (or is free from) the area vertically between the bottommost channel layer 215 and the APT layer 206P, 206N.

The device 200 includes gate spacers 247 on sidewalls of the gate stack 240 and above the topmost channel layer 215, and further includes gate spacers 255 on sidewalls of the gate stack 240 and below the topmost channel layer 215. In the present disclosure, the gate spacers 247 are also referred to as outer spacers 247 or top spacers 247, and the gate spacers 255 are also referred to as inner spacers 255. The inner spacers 255 are disposed laterally between the source/drain features 260N (or 260P) and the gate stacks 240 and vertically between the channel layers 215. In various embodiments, the top spacers 247 may have a width along the "y" direction in a range of about 3 nm to about 12 nm, and the inner spacers 255 may have a width along the "y" direction in a range of about 3 nm to about 12 nm.

In the present embodiment, the device 200 further includes lightly doped source/drain (LDD) regions 262 that are between each channel layer 215 and the S/D features (or heavily doped S/D) 260A/B. The LDD regions 262 between channel layers 215b and S/D features 260N, 260P are surrounded by inner spacers 255, and the LDD regions 262 between the topmost channel layer 215 and S/D features 260N, 260P are surrounded by both inner spacer 255 and top spacer 247. The LDD regions 262 can provide further device performance enhance (such as short channel control) to the GAA device 200.

The device 200 further includes gate-end dielectric features 404 that are disposed at ends of the gate stacks 240 and the top spacers 247. The top spacers 247, inner spacers 255, and gate-end dielectric features 404 provide isolation functions—isolating the gate stacks 240 from each other and from nearby conductors including source/drain features 260N and 260P and source/drain contacts 406 (FIG. 1). In an embodiment, the materials for the top spacers 247, inner spacers 255, and gate-end dielectric features 404 are different from each other and the gate-end dielectric features 404 have the highest dielectric constant among the three. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), (Ba, Sr)$TiO_3$ (BST), hafnium dioxide-alumina ($HfO_2$—$Al_2O_3$) alloy, other suitable high-k dielectric material, or combinations thereof. In a further embodiment, the inner spacers 255 have a higher effective dielectric constant than the top spacers 247. For example, the inner spacers 255 may include a material selected from a group consisting of $SiO_2$, $Si_3N_4$, SiON, SiOC, SiOCN, nitride base dielectric material, air gap, or a combination thereof; and the top spacers 247 may include a material selected from a group consisting of $SiO_2$, $Si_3N_4$, carbon doped oxide, nitrogen doped oxide, porous oxide, air gap, or a combination thereof.

As shown in FIG. 4, the device 200 further includes a gate-top dielectric layer 408 that is disposed over the gate stacks 240. In an embodiment, the thickness of the gate-top dielectric layer 408 is in a range of about 2 nm to about 60 nm. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. The gate-top dielectric layer 408 may be formed by recessing the gate stacks 240 and the top spacers 247 to form trenches, fill the trenches with one or more dielectric materials, and performing a CMP process to remove excessive dielectric materials.

The device 200 further includes silicide features 261 over the source/drain features 260N and 260P, and source/drain contacts 406 over the silicide features 261. The silicide features 261 may be formed by depositing one or more metals over the S/D features 260 (260N and 260P), performing an annealing process to the device 200 to cause reaction between the one or more metals and the S/D features 260 to produce the silicide features 261, and removing un-reacted portions of the one or more metals. The silicide features 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer functions to prevent metal materials of the metal fill layer from diffusing into the dielectric layers adjacent the S/D contacts 406. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406.

In an embodiment, the silicide features 261 and source/drain contacts 406 are formed by etching S/D contact holes using a self-aligned etching process and then performing the above disclosed deposition, annealing, and other processes in the contact holes to forming the silicide features 261 and source/drain contacts 406. The self-aligned etching process uses the gate-top dielectric layer 408, the top spacers 247, and/or the gate-end dielectric features 404 as an etch mask.

The device 200 further includes an inter-layer dielectric (ILD) layer 270. The ILD layer 270 is disposed over the isolation features 230, the source/drain contacts 406, and the gate-top dielectric layers 408. Various features including the S/D features 260, the silicide features 261, the source/drain contacts 406, the gate stacks 240, the top spacers 247, the inner spacers 255, the gate-end dielectric features 404, and the gate-top dielectric layer 408 are embedded in the ILD layer 270. In some embodiments, the device 200 further includes a contact etch stop layer (CESL) between the ILD layer 270 and the S/D features 260, the gate stacks 240, and the top spacers 247. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

The device 200 further includes gate vias 410 that are electrically connected to the gate stacks 240. The device 200 further includes drain vias 411N and 411P that are electrically connected to the contacts 406 disposed on drain features 260N and 260P, respectively; and source vias 412N and 412P that are electrically connected to the contacts 406 disposed on source features 260N and 260P, respectively. Each of the gate vias 410, drain vias 411N/P, and source vias 412N/P may include a conductive barrier layer and a metal fill layer over the conductive barrier layer. The conductive barrier layer functions to prevent metal materials of the metal fill layer from diffusing into the dielectric layers adjacent the via. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the via.

Figure 5:
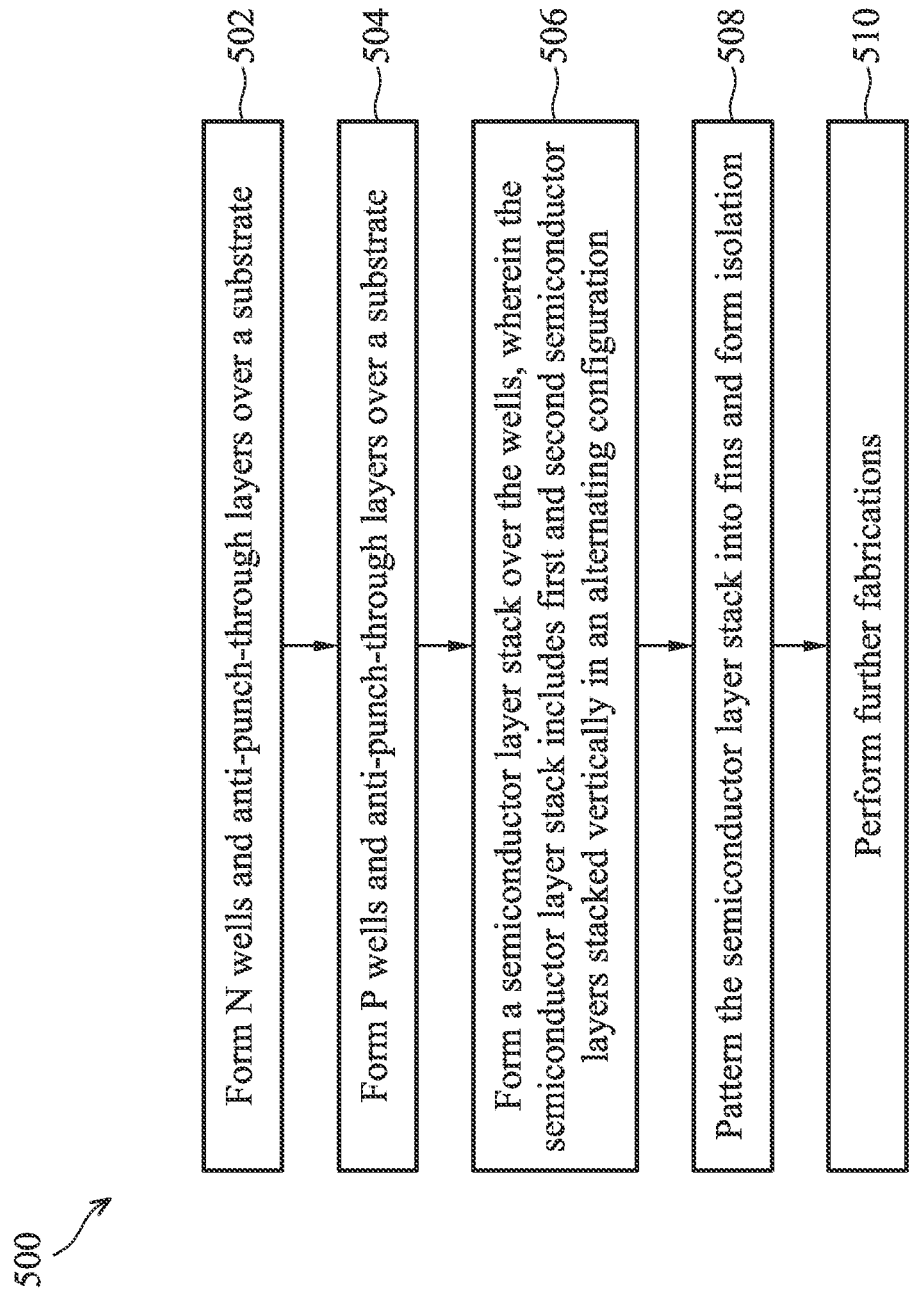
FIG. 5 is a flow chart of a method for fabricating a GAA device according to some embodiments of the present disclosure.

FIG. 5 is a flow chart of a method 500 for fabricating a multi-gate device, such as the device 200, according to various aspects of the present disclosure. Additional processing is contemplated by the present disclosure. Additional steps can be provided before, during, and after method 500, and some of the steps described can be moved, replaced, or eliminated for additional embodiments of method 500.

At step 502, the method 500 forms wells 204N over a substrate 202 and further forms anti-punch-through (APT) layers 206N. A resultant structure is shown in FIG. 4 is an embodiment. For example, the step 502 may form a first hard mask to cover NMOS regions of the substrate 202 and to expose PMOS regions of the substrate 202, and then perform one or more ion implantation processes to the PMOS regions of the substrate 202 to form the N wells 204N. The step 502 may additionally dope the upper section of the N wells 204N with carbon to form the APT layers 206N, such as is shown in FIG. 3A and also FIG. 6A discussed further below. Alternatively, carbon may be implanted throughout the N wells 204N and APT layers 206N, such as is shown in FIG. 3B and also FIG. 6B. The step 502 may control the doping depth and the dopant concentration for the N wells 204N and the APT layer 206N as discussed earlier. Subsequently, the step 502 removes the first hard mask.

At step 504, the method forms the P wells 204P over the substrate 202, and further forms APT layers 206P. A resultant structure is shown in FIG. 4 is an embodiment. For example, the step 504 may form a second hard mask to cover PMOS regions of the substrate 202 and to expose NMOS regions of the substrate 202. Then, the step 504 performs one or more ion implantation processes to the NMOS regions of the substrate 202 to form the P wells 204P. The step 504 may heavily dope the upper section of the P wells 204P to form the APT layer 206P. The step 504 may additionally dope the upper section of the P wells 204P with carbon to form the APT layers 206P, such as is shown in FIG. 2A and also FIG. 7A discussed further below. Alternatively, carbon may be implanted throughout the P wells 204P and APT layers 206P, such as is shown in FIG. 2B and also FIG. 7B discussed further below. The step 504 may control the doping depth and the dopant concentration for the P wells 204P and the APT layer 206P as discussed earlier. Subsequently, the step 504 removes the second hard mask.

Figure 7A:
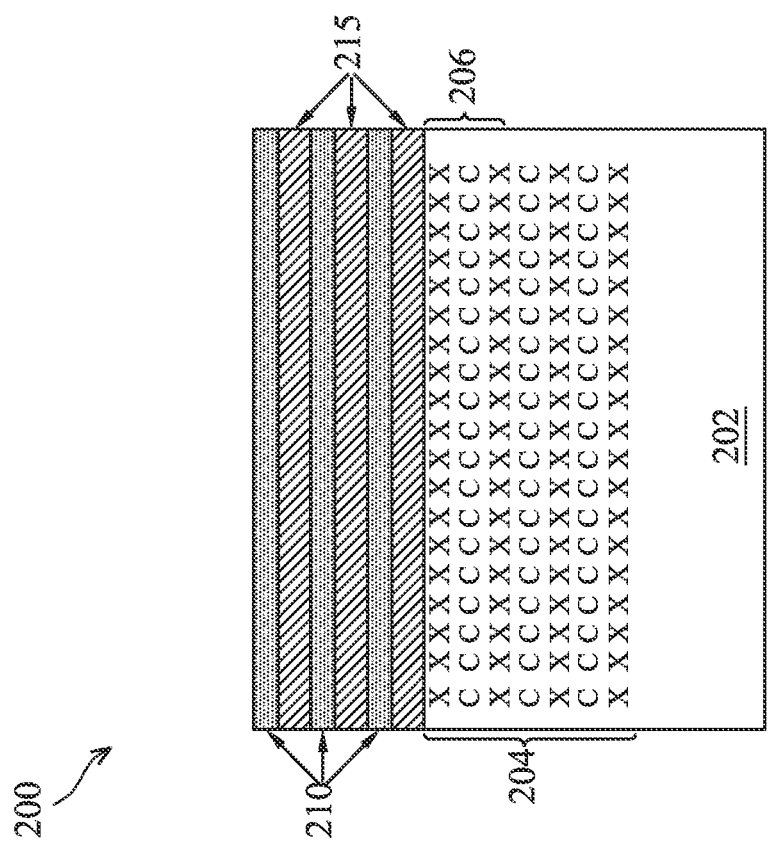
Figure 7B:
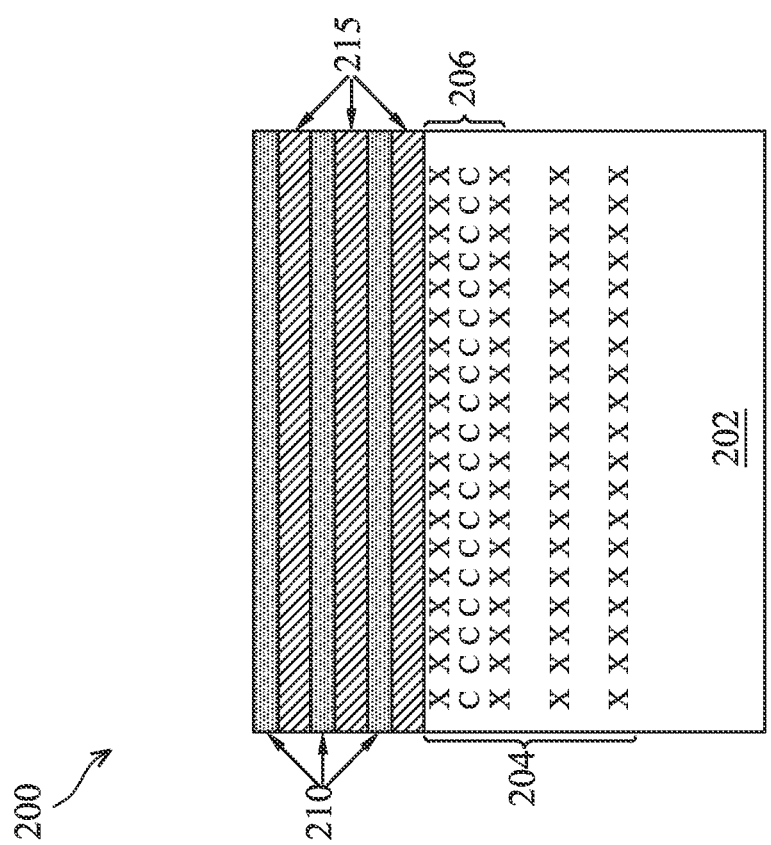

At step 506, the method 500 forms a semiconductor layer stack having semiconductor layers 210 and semiconductor layers 215 stacked vertically in an alternating or interleaving configuration from the top surface of the substrate 202. The resultant structure is shown in FIGS. 7A and 7B according to two different embodiments of the underlying wells and APT layers. In the present embodiments, semiconductor layers 210 and semiconductor layers 215 are epitaxially grown in the depicted interleaving and alternating configuration. For example, a first one of semiconductor layers 215 is epitaxially grown on substrate, a first one of semiconductor layers 210 is epitaxially grown on the first one of semiconductor layers 210, a second one of semiconductor layers 215 is epitaxially grown on the first one of semiconductor layers 210, and so on until semiconductor layers stack has a desired number of semiconductor layers 210 and semiconductor layers 215. In the present embodiment, the semiconductor layers 215 are silicon germanium, while the semiconductor layers 210 are pure silicon. Other embodiments may have different configurations. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

At step 508, the method 500 patterns the semiconductor layer stack into fins and patterns the upper portion of the wells 204 into fins too. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer stack and is patterned using a photolithography process. Spacers are formed alongside the patterned sacrificial layer using a self-aligned process. The sacrificial layer is then removed, and the remaining spacers, or mandrels, may then be used as a masking element for patterning the fins.

The step 508 further forms the isolation features 230. The isolation features 230 can be formed by filling the trenches between the fins with an insulator material, for example, by using a CVD process or a spin-on glass process. A chemical mechanical polishing (CMP) process may be performed to remove excessive insulator material and/or planarize a top surface of isolation features 230. Then an etching back process is performed to recess the isolation features 230 to a desired thickness, such as surrounding a lower portion of the fins and leaving an upper portion of the fins protruding above the isolation features 230. In an embodiment, the hard mask layer 416 is removed during the CMP process or the etching back process.

At step 510, the method 500 performs further fabrication processes to the device 200, to achieve the devices 200 shown in FIG. 1, and eventually a final, completed integrated circuit.

Although not intended to be limiting, one or more embodiments of the present disclosure provide many benefits to a semiconductor device and the formation thereof. For example, embodiments of the present disclosure provide structures (e.g., anti-punch-through layers) and step methods (e.g., gate, source, drain, and well biasing scheme) to reduce leakage current in GAA devices. For example, by combining the disclosed biasing scheme and a carbon-doped APT layer, the leakage current between source and drain terminals of a GAA device in standby mode can be greatly reduced. The disclosed structure and methods can be readily integrated into existing semiconductor manufacturing processes.

In one example aspect, the present disclosure is directed to a semiconductor device, such as a metal-oxide semiconductor field effect transistor (MOSFET), that includes a substrate and a well over the substrate, the well including dopants of a first conductivity-type. The well includes an anti-punch-through (APT) layer at an upper section of the well, the APT layer including the dopants of the first conductivity-type and further including carbon. The device further includes a source feature and a drain feature adjacent the APT layer, being of a second conductivity-type opposite to the first conductivity-type. The device further includes multiple channel layers over the APT layer and connecting the source feature to the drain feature, wherein the multiple channel layers are vertically stacked one over another. The device further includes a gate wrapping around each of the channel layers, such as in a gate-all-around device, wherein a first portion of the gate is disposed between a bottommost one of the channel layers and the APT layer.

In another example, the semiconductor device includes a substrate, a first well over the substrate doped throughout with an n-type dopant and with carbon, the first well including a first anti-punch-through (APT) layer at an upper section of the first well, and a second well over the substrate doped throughout with a p-type dopant and with carbon, the second well including a second APT layer at an upper section of the second well. The device further includes a first source feature and a first drain feature over the first APT layer and including a p-type dopant, and a second source feature and a second drain feature over the second APT layer and including an n-type dopant. The device includes a first group of multiple channel layers suspended over the first APT layer and connecting the first source feature to the first drain feature, wherein the first multiple channel layers are vertically stacked one over another, and a second group of multiple channel layers suspended over the second APT layer and connecting the second source feature to the second drain feature, wherein the second multiple channel layers are vertically stacked one over another. The device further includes a high-k metal gate wrapping around three sides of each of the first and second groups of multiple channel layers, The device includes a plurality of inner dielectric spacers disposed between the high-k metal gate and the first and second source features and the first and second drain features, and a top dielectric disposed over sidewalls of the high-k metal gate and over a topmost one of the channel layers of each group.

In another example, the semiconductor device includes a substrate with a first well over the substrate doped throughout with an n-type dopant, the first well including a first anti-punch-through (APT) layer at an upper section of the first well that is also doped with carbon, wherein there is substantially no carbon in the first well except at the first APT layer, and with a second well over the substrate doped throughout with a p-type dopant, the second well including a second APT layer at an upper section of the second well that is also doped with carbon, wherein there is substantially no carbon in the second well except at the second APT layer. The device further includes a first source feature and a first drain feature over the first APT layer and including a p-type dopant and a second source feature and a second drain feature over the second APT layer and including an n-type dopant. The device includes a first group of multiple channel layers suspended over the first APT layer and connecting the first source feature to the first drain feature, wherein the first multiple channel layers are vertically stacked one over another, and a second group of multiple channel layers suspended over the second APT layer and connecting the second source feature to the second drain feature, wherein the second multiple channel layers are vertically stacked one over another. The device further includes a high-k metal gate wrapping around three sides of each of the first and second groups of multiple channel layers. The device also includes a plurality of inner dielectric spacers disposed between the high-k metal gate and the first and second source features and the first and second drain features and a top dielectric disposed over sidewalls of the high-k metal gate and over a topmost one of the channel layers of each group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first well over the substrate, the first well including dopants of a first conductivity-type;
   a first anti-punch-through (APT) layer at an upper section of the first well, the first APT layer including the dopants of the first conductivity-type and further including carbon;
   a source feature and a drain feature adjacent the APT layer and being of a second conductivity-type opposite to the first conductivity-type;
   multiple channel layers over the APT layer and connecting the source feature to the drain feature, wherein the multiple channel layers are vertically stacked one over another; and
   a gate wrapping around each of the channel layers, wherein a first portion of the gate is disposed between a bottommost one of the channel layers and the APT layer,
   wherein the first well is fully doped with carbon.

2. The semiconductor device of claim 1, wherein a bottom surface of the source feature is deeper, with respect to the substrate, than an interface between the gate and the first APT layer, by about 5 nm to about 25 nm.

3. The semiconductor device of claim 2, wherein a bottom surface of the drain feature is deeper, with respect to the substrate, than the interface between the gate and the first APT layer by about 5 nm to about 25 nm.

4. The semiconductor device of claim 3, wherein the first APT layer is below the interface between the gate and the first APT layer by about 5 nm to about 25 nm.

5. The semiconductor device of claim 1, further comprising:
   an isolation feature over the substrate and adjacent to the upper sections of the first well and adjacent the first APT layer.

6. The semiconductor device of claim 5, further comprising:
   a second well over the substrate, the second well including dopants of the second conductivity-type; and
   a second APT layer at an upper section of the second well, the second APT layer including the dopants of the second conductivity-type and further including carbon.

7. The semiconductor device of claim 6, further comprising:
   an isolation feature over the substrate and adjacent to the upper sections of the first and second wells and adjacent the first APT layer and the second APT layer.

8. The semiconductor device of claim 6, wherein the second well is fully doped with carbon.

9. The semiconductor device of claim 1, wherein the multiple channel layers are epitaxially grown silicon germanium.

10. The semiconductor device of claim 1, wherein the multiple channel layers are interleaved by a plurality of inner dielectric spacers to space the gate apart from the source feature and the drain feature.

11. The semiconductor device of claim 1, further comprising:
   a top spacer disposed along a sidewall of the gate and over the channel layers; and
   a gate top dielectric layer disposed on top surfaces of the top spacer and the gate.

12. The semiconductor device of claim 11, further comprising:
   a contact feature disposed over the source feature,
   wherein the contact feature is electrically coupled to the source feature by way of a silicide layer.

13. A semiconductor device, comprising:
   a substrate;
   a first well over the substrate doped throughout with an n-type dopant and with carbon, the first well including a first anti-punch-through (APT) layer at an upper section of the first well;
   a second well over the substrate doped throughout with a p-type dopant and with carbon, the second well including a second APT layer at an upper section of the second well;
   a first source feature and a first drain feature over the first APT layer and including a p-type dopant;
   a second source feature and a second drain feature over the second APT layer and including an n-type dopant;
   a first group of multiple channel layers suspended over the first APT layer and connecting the first source feature to the first drain feature, wherein the first multiple channel layers are vertically stacked one over another;
   a second group of multiple channel layers suspended over the second APT layer and connecting the second source feature to the second drain feature, wherein the second multiple channel layers are vertically stacked one over another;
   a high-k metal gate wrapping around three sides of each of the first and second groups of multiple channel layers,
   a plurality of inner dielectric spacers disposed between the high-k metal gate and the first and second source features and the first and second drain features; and
   a top dielectric disposed over sidewalls of the high-k metal gate and over a topmost one of the channel layers of each group.

14. The semiconductor device of claim 13, further comprising:
   an isolation feature over the substrate, adjacent to and between the upper sections of the first and second well, and adjacent the first and second APT layers,
   wherein portions of the first and second wells are under the isolation feature.

15. The semiconductor device of claim 13, wherein the n-type dopant is phosphorus and the p-type dopant is boron.

16. The semiconductor device of claim 15, wherein the first well has a dopant concentration of phosphorus and carbon in a range of about 1E16 atom/cm$^3$ to about 1E19 atom/cm$^3$.

17. The semiconductor device of claim 16, wherein the second well has a dopant concentration of boron and carbon in a range of about 1E16 atom/cm$^3$ to about 1E19 atom/cm$^3$.

18. The semiconductor device of claim 13 wherein
   the first source feature and the first drain feature extend into the first well a first amount; and
   the second source feature and the second drain extend into the second well a second amount, different from the first amount.

19. A semiconductor device, comprising:
   a substrate;
   a first well over the substrate doped throughout with an n-type dopant, the first well including a first anti-punch-through (APT) layer at an upper section of the first well that is also doped with carbon, wherein there is substantially no carbon in the first well except at the first APT layer;
   a second well over the substrate doped throughout with a p-type dopant, the second well including a second APT layer at an upper section of the second well that is also doped with carbon, wherein there is substantially no carbon in the second well except at the second APT layer;
   a first source feature and a first drain feature over the first APT layer and including a p-type dopant;
   a second source feature and a second drain feature over the second APT layer and including an n-type dopant;
   a first group of multiple channel layers suspended over the first APT layer and connecting the first source feature to the first drain feature, wherein the first multiple channel layers are vertically stacked one over another;
   a second group of multiple channel layers suspended over the second APT layer and connecting the second source feature to the second drain feature, wherein the second multiple channel layers are vertically stacked one over another;
   a high-k metal gate wrapping around three sides of each of the first and second groups of multiple channel layers,
   a plurality of inner dielectric spacers disposed between the high-k metal gate and the first and second source features and the first and second drain features; and
   a top dielectric disposed over sidewalls of the high-k metal gate and over a topmost one of the channel layers of each group,
   wherein the first source feature and the first drain feature extend into the first well a first amount and the second source feature and the second drain extend into the second well a second amount different from the first amount.

20. The semiconductor device of claim 19, wherein the first amount is greater than the second amount.

* * * * *